United States Patent [19]
Krymski

[11] Patent Number: 6,049,247
[45] Date of Patent: Apr. 11, 2000

[54] LOW-VOLTAGE COMMON SOURCE SWITCHED-CAPACITOR AMPLIFIER

[75] Inventor: Alexander I. Krymski, Montrose, Calif.

[73] Assignee: Photobit Corporation, Pasadena, Calif.

[21] Appl. No.: 09/215,571

[22] Filed: Dec. 16, 1998

Related U.S. Application Data

[60] Provisional application No. 60/068,155, Dec. 16, 1997.

[51] Int. Cl.[7] ........................................... H03F 1/02
[52] U.S. Cl. .................................. 330/9; 330/86
[58] Field of Search .................. 330/9, 86, 110, 330/51; 327/554

[56] References Cited

U.S. PATENT DOCUMENTS

| | | | |
|---|---|---|---|
| 4,179,665 | 12/1979 | Gregorian | 330/107 |
| 4,331,894 | 5/1982 | Gregorian et al. | 307/520 |
| 4,404,525 | 9/1983 | Amir et al. | 330/9 |
| 4,617,481 | 10/1986 | Masuda | 307/491 |
| 5,880,630 | 3/1999 | Iwamoto et al. | 330/9 |

FOREIGN PATENT DOCUMENTS

| | | | |
|---|---|---|---|
| 60-128702 | 7/1985 | Japan | 330/9 |

*Primary Examiner*—Robert Pascal
*Assistant Examiner*—Henry Choe
*Attorney, Agent, or Firm*—Fish & Richardson P.C.

[57] ABSTRACT

The present disclosure describes a low-voltage switched-capacitor amplifier circuit that operates with supply voltage as low as one volt. The switched-capacitor amplifier circuit includes a voltage-amplifying transistor configured in a switched-capacitor network by an input capacitor and a feedback capacitor. The gate terminal of the voltage-amplifying transistor is connected to the supply voltage through a first switch that turns on during stage 1 of the reset phase. During stage 2, the first switch opens and a second switch is closed. The second switch is in series with a second transistor. The second transistor maintains certain voltage difference between the input and the output and keeps the output voltage from pulling the input voltage down to ground.

26 Claims, 3 Drawing Sheets

LOW-VOLTAGE COMMON SOURCE SWITCHED-CAPACITOR AMPLIFIER

CROSS-REFERENCE TO RELATED APPLICATIONS

This application claims benefit of the priority of U.S. Provisional Application Serial No. 60/068,155, filed Dec. 16, 1997 and entitled "A 1 V Common Source Switched-Capacitor Amplifier."

TECHNICAL FIELD

The invention relates to low-voltage operational amplifier ("op amp") circuits, and more particularly to a low-voltage common source switched-capacitor amplifier.

BACKGROUND

Amplifiers are widely used in electronic circuits. The amplifiers are popular because they have characteristics that are desirable for voltage amplification. The amplifier circuits are characterized by high input impedance and low output impedance that allow extremely small input currents, and hence low power, to drive the circuit and relatively stable output for large current flow.

Generally, an amplifier amplifies an input signal and provides the amplified signal at the output. The amplifier may be supplied with positive and negative voltages ranging from 5 to 15 volts. They are usually characterized by the amount of amplification and bandwidth of operation.

A switched-capacitor amplifier is a type of amplifier that operates in discrete steps. It is a clocked circuit that uses transistor switches to couple the capacitors in different configurations. For example, in a first phase of a clock cycle a voltage may be sampled by charging the capacitors of the switched-capacitor amplifier. In a second phase, the capacitors are coupled by transistor switches into a configuration to amplify the sampled voltage stored in the capacitors.

FIG. 1 shows a conventional common source switched-capacitor amplifier 100 with threshold voltage of transistors at approximately 0.7 to 0.9 volts. The input voltage 104 of the NMOS transistor amplifier 100 must be slightly higher than the threshold voltage of the NMOS transistor during a reset phase when the switch 102 is closed. However, when the supply voltage 106, $V_{dd}$, is relatively low at about 1 to 1.5 volts, the input of the NMOS transistor amplifier 100 cannot be pulled up to a satisfactory voltage level for the capacitors to discharge.

SUMMARY

There is often a need to operate from a low voltage. For example, single battery cells often have voltages of about 1.5 volts. Solar cells also have relatively low voltages.

The present disclosure describes a low-voltage switched-capacitor amplifier circuit that operates with supply voltage as low as one volt. The switched-capacitor amplifier circuit includes a voltage-amplifying transistor configured in a switched-capacitor network by an input capacitor and a feedback capacitor. In an alternative embodiment, the transistor can be a charge-sensitive amplifier when the voltage input is directly connected to a gate terminal of the transistor. In the absence of the feedback capacitor, the switched-capacitor amplifier can use gate-to-drain capacitance, called Miller capacitance, of the transistor as feedback capacitance.

The gate terminal of the voltage-amplifying transistor is connected to the supply voltage through a first switch that turns on during stage 1 of the reset phase. During stage 2, the first switch opens and a second switch is closed. The second switch is in series with a second transistor. The second transistor maintains certain voltage difference between the input and the output and keeps the output voltage from pulling the input voltage down to ground.

In a preferred embodiment, the voltage-amplifying transistor is an enhancement mode NMOS transistor. Also, the second transistor is an enhancement mode NMOSFET transistor. The switched are implemented with MOSFET transistors. In a particular embodiment, the input capacitor is about 500 fF and the feedback capacitor is about 3.5 fF.

The present disclosure also includes a protection circuit for the second transistor from leakage current when the said second switch is switched open. The protection circuit is provided by coupling an inverter and a leakage stopper capacitor. The leakage stopper capacitor is about 1 fF.

The circuit further includes leakage current protection capacitors connected to a source terminal of the second transistor and a drain terminal of the voltage amplifying transistor.

In a further embodiment, the amplifier circuit has an active current load. The active current load includes a pair of diode-connected PMOSFET transistors configured to supply current to the voltage-amplifying transistor.

Other embodiments and advantages will become apparent from the following description and from the claims.

BRIEF DESCRIPTION OF THE DRAWINGS

These and other aspects of the invention will now be described with reference to the attached drawings, in which.

DETAILED DESCRIPTION

The present disclosure describes a low-voltage common source switched-capacitor amplifier.

Figure 2:
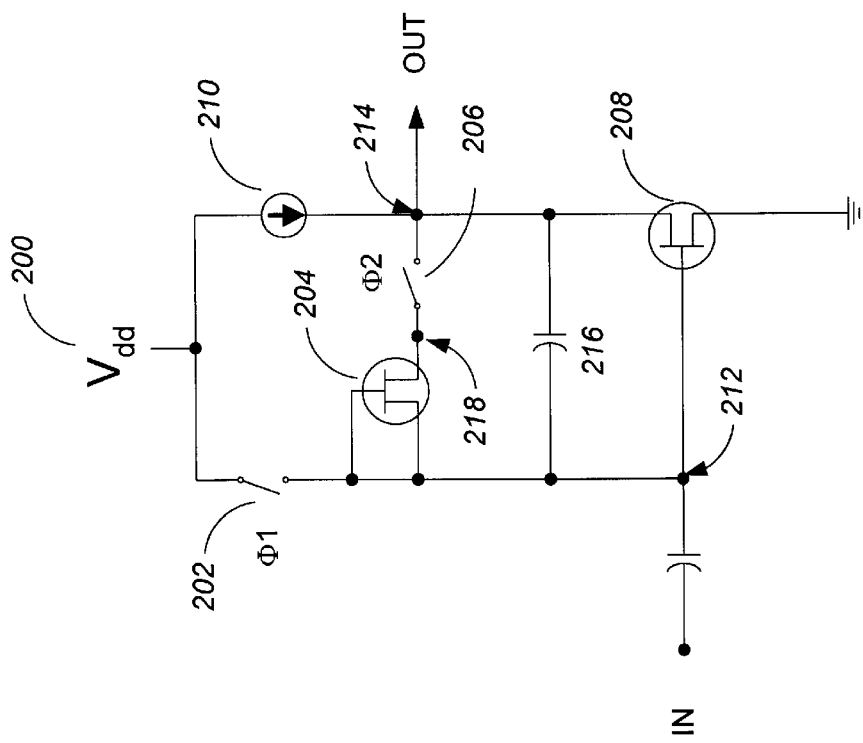
FIG. 2 is a simplified schematic diagram of a preferred embodiment of the low voltage common source switched-capacitor amplifier.
Figure 1:
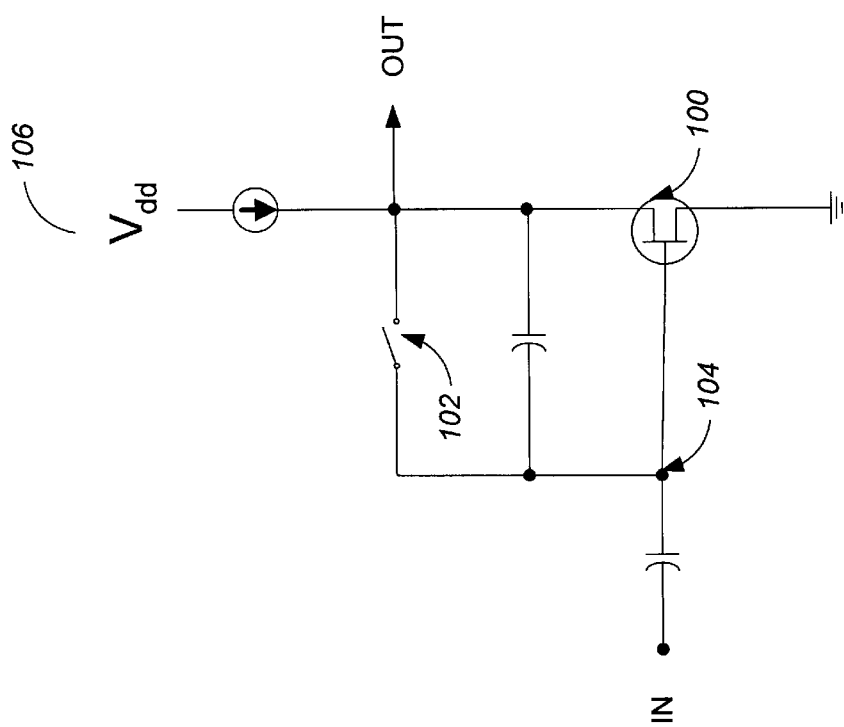
FIG. 1 is a simplified schematic diagram of a typical prior art common source switched-capacitor amplifier.

FIG. 2 shows a simplified circuit diagram according to the preferred embodiment of the present disclosure. According to the disclosure, the circuit will operate satisfactorily during a reset phase with power supply voltage 200 as low as one volt. The circuit shown in FIG. 2 accomplishes the reset of the low-voltage circuit in two stages.

During stage 1, the NMOS transistor amplifier 208 input 212 is clamped to the supply voltage 200 by a closed Φ1 switch 202. Since the NMOS transistor amplifier input 212 is above the threshold voltage, the NMOS transistor 208 is turned on. When the transistor 208 is turned on, the output node 214 is pulled close to the ground.

In stage 2, the Φ1 switch 202 is open and the Φ2 switch 206 is closed. The input 212 and output 214 of the amplifier 208 are coupled together through a diode-connected NMOSFET transistor 204 and the Φ2 switch 206. Initially, the voltage across this transistor 204 is higher than its threshold voltage so the current flows from the input 212 to the output 214. However, as the voltage stored in capacitor 216 is discharged, the input voltage drops while the output voltage rises. Thus, the reset current passing through the NMOSFET transistor 204 drops significantly. The reset current will be less than the current through the amplifier 208. Finally, the circuit settles into a quasi-equilibrium state where the input voltage is slightly above the threshold voltage of the NMOS transistor amplifier 208 by an amount equal to the potential drop in the channel of the active NMOSFET transistor 204. This is typically between 50 and 100 millivolts. The node 214 is connected to the supply voltage through a current load 210.

The reset phase is completed by opening the Φ2 switch 206. However, care must be taken in turning the diode-connected NMOSFET transistor 204 off to prevent continuing discharge of current. The discharge can induce a slew rate of about one millivolt per microsecond. To prevent such a discharge, the potential of node 218 must be biased to at least 200 millivolts during opening of the switch 206.

Figure 3:
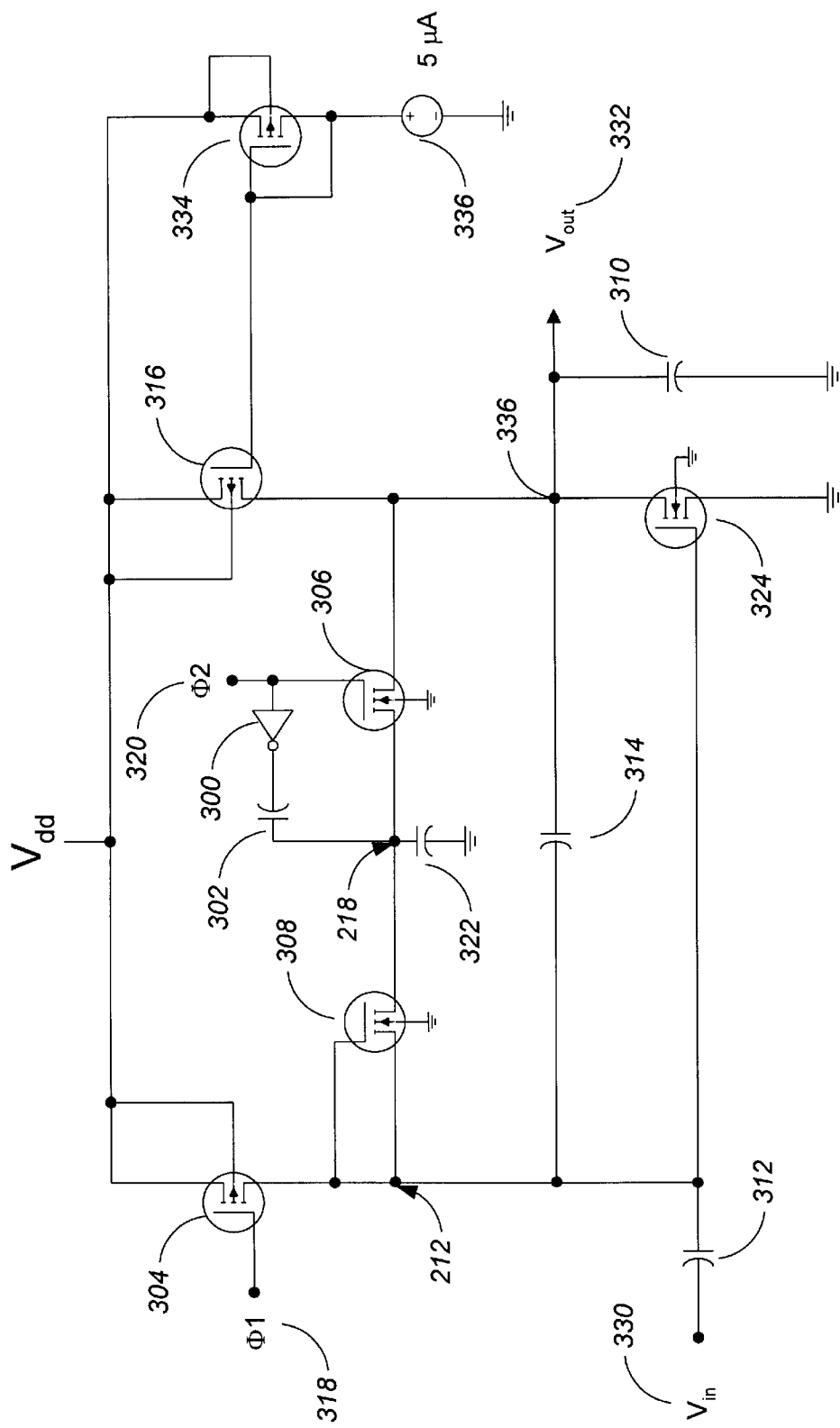
FIG. 3 is a detailed schematic diagram of a preferred embodiment of the low voltage common source switched-capacitor amplifier.

FIG. 3 shows a detailed schematic diagram of the present embodiment. The input voltage 330 is fed into a gate terminal 326 of the NMOSFET transistor amplifier 324 through an input capacitor 312. The gain of the amplifier depends on the voltage charged up by the feedback capacitor 314 and can be determined by the ratio of input to feedback capacitors.

The Φ1 switch 202 is implemented by a PMOSFET transistor 304 and the Φ2 switch 206 by an NMOSFET transistor 306. The Φ1 signal drives the PMOSFET transistor 304 and the Φ2 signal drives the NMOSFET transistor 306. Prior to a reset phase, the output voltage 332 remains at about 0.9 volts. The voltages at nodes 212 and 218 are about 0.7 and 0.4 volts respectively.

During stage 1, the PMOSFET transistor 304 is turned on while the NMOSFET transistor 306 is turned off. In this stage, the node 212 is charged to $V_{dd}$. The voltage at node 212 opens the NMOS transistor amplifier 324 thereby pulling the output to ground. During stage 2, the NMOSFET transistor 306 is turned on while the PMOSFET transistor 304 is turned off. This configuration brings node 212 back down to about 0.7 volts. The output voltage 332 slowly moves up to a reset level of about 0.1 volts. Finally, the NMOSFET transistor 306 is turned off by the Φ2 signal to complete the reset phase. At this point, the node 218 is protected from undesired leakage current by coupling the inverted Φ2 signal to the node. The coupling is accomplished by an inverter 300 and a leakage stopper capacitor 302.

After the reset phase, the amplifier circuit goes through the normal switched capacitor amplifier mode. The output voltage returns to about 0.9 volts. The nodes 212 and 218 stay at about 0.7 and 0.4 volts respectively. Capacitors 310 and 322 prevent leakage currents for nodes 218 and 336.

The current mirror diode-connected PMOSFET transistor 334 and PMOSFET transistor 316 supply current to the voltage amplifying transistor 324. The transistors act as active current load to supply current from a current source 336.

Figure 4:
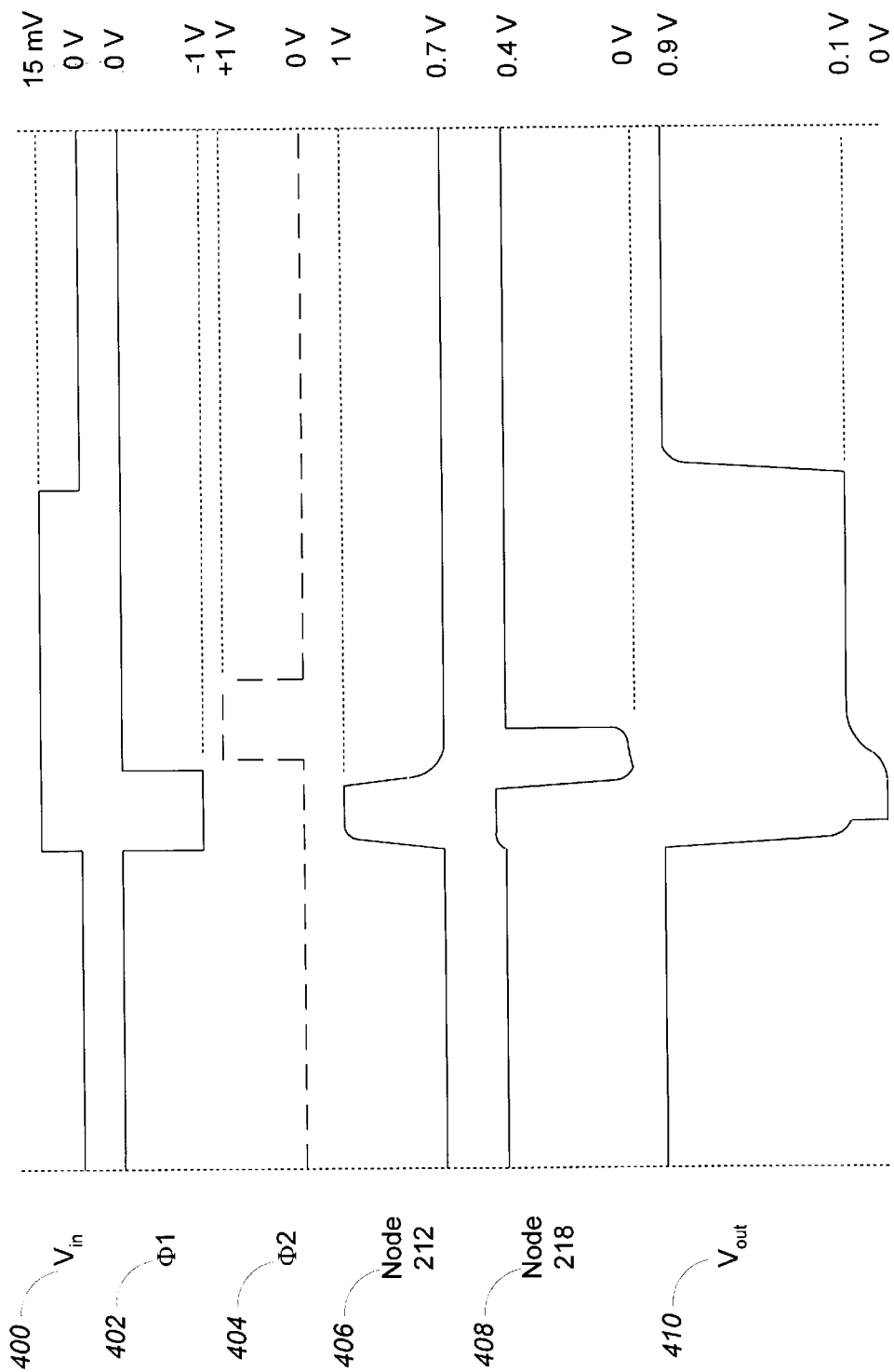
FIG. 4 is a timing diagram of a simulation performed using the low-voltage common source switched-capacitor amplifier.

FIG. 4 shows a timing diagram of a simulation performed using the low-voltage common source switched-capacitor amplifier. The figure shows an input voltage 400 swing of about 15 millivolts resulting in an output voltage 410 swinging from about 0.1 volts to about 0.9 volts. Hence, the amplifier gain is found to be slightly more than 50 at operating frequency of 2 MHZ.

The Φ1 402 and Φ2 404 signals move between 0 and ±1 volts during the reset phase. The voltage 406 at node 212 goes up to 1 volt during phase 1 and returns to 0.7 volts at phase 2. The voltage 408 at node 218 is set to ground during phase 2 and returns to about 0.4 volts after transistor 306 is turned off.

A number of embodiments of the present invention have been described. Nevertheless, it will be understood that various modifications may be made without departing from the spirit and scope of the invention. Accordingly, other embodiments are within the scope of the following claims.

What is claimed is:

1. A low-voltage switched-capacitor amplifier circuit comprising:

a connection to a power supply, receiving a supply voltage;

a first transistor configured in a switched-capacitor network, and having a gate, a source, and a drain terminal, such that said drain terminal is connected to said supply voltage through an active current load;

a plurality of switches, said plurality of switches connected to a plurality of signal sources, such that each signal source drives a switch, wherein a first switch of said plurality of switches connects to said supply voltage and said gate of said first transistor; and a second transistor connected in series with a second switch of said plurality of switches, said second transistor and said second switch being coupled to said gate and said drain of said first transistor, such that said second transistor and said second switch are connected in parallel with said feedback capacitor, and gate and drain terminals of said second transistor connects to said gate terminal of said first transistor.

2. The low-voltage switched-capacitor amplifier circuit of claim 1, wherein said switched-capacitor network is formed by an input capacitor and a feedback capacitor.

3. The low-voltage switched-capacitor amplifier circuit of claim 1, wherein said switched-capacitor network is formed by a feedback capacitor, such that said first transistor is acting as a charge-sensitive amplifier.

4. The low-voltage switched-capacitor amplifier circuit of claim 1, wherein said switched-capacitor network is formed by said first transistor, such that a capacitance formed between said gate and said drain terminals of the first transistor serves as a feedback capacitance.

5. The low-voltage switched-capacitor amplifier circuit of claim 1, wherein said supply voltage is approximately 1 volt.

6. The low-voltage switched-capacitor amplifier circuit of claim 1, wherein said first transistor is an enhancement mode NMOS transistor.

7. The low-voltage switched-capacitor amplifier circuit of claim 1, wherein said second transistor is an enhancement mode NMOSFET transistor.

8. The low-voltage switched-capacitor amplifier circuit of claim 1, wherein said plurality of switches are formed with MOSFET transistors.

9. The low-voltage switched-capacitor amplifier circuit of claim 1, wherein said first switch of said plurality of switches is an enhancement mode PMOSFET transistor.

10. The low-voltage switched-capacitor amplifier circuit of claim 1, wherein said second switch of said plurality of switches is an enhancement mode NMOSFET transistor.

11. The low-voltage switched-capacitor amplifier circuit of claim 2, wherein said input capacitor is about 500 fF and said feedback capacitor is about 3.5 fF.

12. The low-voltage switched-capacitor amplifier circuit of claim 7, further comprising a protection circuit for said NMOSFET transistor from leakage current when said second switch of said plurality of switches is switched open.

13. The low-voltage switched-capacitor amplifier circuit of claim 12, wherein said protection circuit is provided by coupling of an inverter and a leakage stopper capacitor.

14. The low-voltage switched-capacitor amplifier circuit of claim 13, wherein said leakage stopper capacitor is about 1 fF.

15. The low-voltage switched-capacitor amplifier circuit of claim 1, further comprising a leakage current protection capacitor connected to a source terminal of said second transistor.

16. The low-voltage switched-capacitor amplifier circuit of claim 15, wherein said leakage current protection capacitor is about 2 fF.

17. The low-voltage switched-capacitor amplifier circuit of claim 1, further comprising a leakage current protection capacitor connected to said drain terminal of said first transistor.

18. The low-voltage switched-capacitor amplifier circuit of claim 17, wherein said leakage current protection capacitor is about 25 pF.

19. The low-voltage switched-capacitor amplifier circuit of claim 1, further comprising an active current load, said active current load including a current mirror diode-connected PMOSFET transistor and a PMOSFET transistor configured to supply current to said first transistor.

20. A low-voltage switched-capacitor amplifier circuit comprising:
  a connection to a power supply, receiving a supply voltage;
  a first transistor configured in a switched-capacitor network, and having a gate, a source, and a drain terminal, such that said drain terminal is connected to said supply voltage through an active current load;
  a plurality of switches, said plurality of switches connected to a plurality of signal sources, such that each signal source drives a switch of said plurality of switches, wherein a first switch of said plurality of switches connects to said supply voltage and said gate of said first transistor;
  a second transistor connected in series with a second switch of said plurality of switches, said second transistor and said second switch being coupled to said gate and said drain of said first transistor, such that said second transistor and said second switch are connected in parallel with said feedback capacitor, and gate and drain terminals of said second transistor connects to said gate terminal of said first transistor;
  a protection circuit for said second transistor from leakage current when said second switch is switched open;
  a leakage current protection capacitor connected to said drain terminal of said first transistor; and
  a leakage current protection capacitor connected to a source terminal of said second transistor.

21. The low-voltage switched-capacitor amplifier circuit of claim 20, wherein said switched-capacitor network is formed by an input capacitor and a feedback capacitor.

22. The low-voltage switched-capacitor amplifier circuit of claim 20, wherein said switched-capacitor network is formed by a feedback capacitor, such that said first transistor is acting as a charge-sensitive amplifier.

23. The low-voltage switched-capacitor amplifier circuit of claim 20, wherein said switched-capacitor network is formed by said first transistor, such that a capacitance formed between said gate and said drain terminals of the first transistor serves as a feedback capacitance.

24. The low-voltage switched-capacitor amplifier circuit of claim 20, wherein said protection circuit is provided by coupling of an inverter and a leakage stopper capacitor.

25. The low-voltage switched-capacitor amplifier circuit of claim 20, wherein said leakage stopper capacitor is about 1 fF.

26. The low-voltage switched-capacitor amplifier circuit of claim 20, further comprising an active current load, said active current load including a pair of diode-connected PMOSFET transistor configured to supply current to said first transistor.

* * * * *